(12) United States Patent
Deliwala

(10) Patent No.: US 11,815,545 B2
(45) Date of Patent: *Nov. 14, 2023

(54) STABLE MEASUREMENT OF SENSORS, METHODS AND SYSTEMS

(71) Applicant: Analog Devices, Inc., Wilmington, MA (US)

(72) Inventor: Shrenik Deliwala, Andover, MA (US)

(73) Assignee: ANALOG DEVICES, INC., Norwood, MA (US)

(*) Notice: Subject to any disclaimer, the term of this patent is extended or adjusted under 35 U.S.C. 154(b) by 247 days.

This patent is subject to a terminal disclaimer.

(21) Appl. No.: 17/174,866

(22) Filed: Feb. 12, 2021

(65) Prior Publication Data

US 2021/0165037 A1 Jun. 3, 2021

Related U.S. Application Data

(63) Continuation of application No. 16/792,596, filed on Feb. 17, 2020, now Pat. No. 10,921,367.
(Continued)

(51) Int. Cl.
*G01R 31/28* (2006.01)
*G01N 15/06* (2006.01)
*G01N 15/00* (2006.01)

(52) U.S. Cl.
CPC ......... *G01R 31/2829* (2013.01); *G01N 15/06* (2013.01); *G01N 2015/0046* (2013.01); *G01N 2015/0693* (2013.01)

(58) Field of Classification Search
CPC .............. G01R 31/2829; G01N 15/06; G01N 2015/0046; G01N 2015/0693;
(Continued)

(56) References Cited

U.S. PATENT DOCUMENTS

| 5,400,014 A | 3/1995 | Behkle et al. |
| 5,689,114 A | 11/1997 | Miyazaki et al. |

(Continued)

FOREIGN PATENT DOCUMENTS

| CN | 103890537 A | 6/2014 |
| EP | 2492882 A1 | 8/2012 |

(Continued)

OTHER PUBLICATIONS

EN Abstract of EP2492882A1, 1 page.
Office Action in CN202010151441.7, dated Mar. 1, 2023, 12 pages.

*Primary Examiner* — Giovanni Astacio-Oquendo
*Assistant Examiner* — Zannatul Ferdous
(74) *Attorney, Agent, or Firm* — ArentFox Schiff LLP

(57) ABSTRACT

Gain independent reference channel measurement system and method. A method of making robust, stable measurements, in a variety of different applications is disclosed. More specifically, this disclosure describes systems and methods relating to performing gain independent reference channel measurements by making two phase measurements of a device under test. Mathematically, the measurements are combined and many common mode parameters drop out. The result yields an analysis of a device under test analysis which mitigated errors, predominately arising from environmental variations and changes in circuit behavior stemming from swings in signal input.

14 Claims, 7 Drawing Sheets

Related U.S. Application Data

(60) Provisional application No. 62/814,291, filed on Mar. 6, 2019.

(58) Field of Classification Search
CPC ............. G01N 21/3504; G01N 21/534; G01N 21/274; G01N 27/4162; G01N 2201/062; G01J 1/44; H03F 3/087
See application file for complete search history.

(56) References Cited

U.S. PATENT DOCUMENTS

| | | | |
|---|---|---|---|
| 6,067,840 | A | 5/2000 | Chelvayohan et al. |
| 2002/0084907 | A1 | 7/2002 | Rattman et al. |
| 2008/0266558 | A1 | 10/2008 | Hess et al. |
| 2009/0268204 | A1 | 10/2009 | Tkachuk |
| 2011/0204236 | A1 | 8/2011 | Wong |
| 2016/0231239 | A1 | 8/2016 | Kotidis et al. |
| 2016/0334272 | A1* | 11/2016 | Saito ................. H01L 31/02019 |
| 2018/0231396 | A1* | 8/2018 | Mori ....................... G01R 33/07 |
| 2022/0065908 | A1* | 3/2022 | Salkie .................... G01N 27/07 |

FOREIGN PATENT DOCUMENTS

| | | | |
|---|---|---|---|
| GB | 2000282 | A | 1/1979 |
| GB | 2270157 | A | 3/1994 |
| WO | 01/95279 | A1 | 12/2001 |
| WO | 2018078384 | A1 | 5/2018 |

\* cited by examiner

STABLE MEASUREMENT OF SENSORS, METHODS AND SYSTEMS

CROSS-REFERENCE TO RELATED APPLICATIONS

This application is a continuation (and claims the benefit of priority under 35 U.S.C. § 120) of U.S. patent application Ser. No. 16/792,596, now U.S. Pat. No. 10,921,367, filed on Feb. 17, 2020, and entitled "STABLE MEASUREMENT OF SENSORS METHODS AND SYSTEMS", which is related to and claims the benefit of priority under 35 U.S.C. § 119(e) to U.S. Provisional Patent Application No. 62/814,291 entitled, "STABLE MEASUREMENT OF SENSORS METHODS AND SYSTEMS" filed on Mar. 6, 2019 and related to U.S. Utility patent application Ser. No. 16/181,878 entitled, "COMPACT OPTICAL SMOKE DETECTOR SYSTEM AND APPARATUS" filed on Nov. 6, 2018, U.S. Utility patent application Ser. No. 16/699,677 entitled, "FIRE DETECTION SYSTEM" filed on Dec. 1, 2019, U.S. Utility patent application Ser. No. 14/500,129 entitled, "LOW FREQUENCY NOISE IMPROVEMENT IN PLETHYSMOGRAPHY MEASUREMENT SYSTEMS" filed on Sep. 29, 2014, U.S. Utility patent application Ser. No. 15/993,188 entitled, "COMPACT OPTICAL GAS DETECTION SYSTEM AND APPARATUS" filed on May 30, 2018, U.S. Provisional Patent Application No. 62/859,276 entitled, "GAS DETECTION USING DIFFERENTIAL PATH LENGTH MEASUREMENT" filed on Jun. 10, 2019, all of which are hereby incorporated by reference in their entirety.

FIELD OF THE DISCLOSURE

The present disclosure relates to a method of making stable measurements, in a variety of different applications. More specifically, this disclosure describes systems and methods relating to performing gain independent reference channel measurements and applications thereto.

BACKGROUND

Reference channel measurements are system measurements performed in parallel with the measurement of a device under test (DUT). Reference channel measurements serve as a control measurement to be used in comparison with device under test (DUT) measurement. In theory environmental changes and signal variation is supposed to affect the two measurement pathways equally. To this end, differences between the device under test (DUT) pathway and the Reference channel measurement pathway should solely reflect a change in stimuli. Accordingly, circuits can be calibrated after assembly to compensate for measurement pathway disparities.

However, the inventor of the present disclosure has found this not entirely, particularly in attempting sensitive measurement. Specifically, environmental changes and signal variations (e.g., nonlinearities resulting from high current, etc.) can affect respective gain amplifiers differently. Consequently, the accuracy of the device under test (DUT) measurement can be compromised, sometimes on the order of magnitudes. Accordingly, there is a long felt need for a Reference channel measurement which can be implemented with only nominal architecture modifications.

The inventor of the present disclosure has identified these shortcomings and recognized a need for a new reference channel measurement technique that is more stable and superior to the traditional reference channel measurements. That is, a robust reference channel measurement which not only accounts for common mode changes but gain differences between amplifiers.

This disclosure is intended to provide an overview of subject matter of the present patent application. It is not intended to provide an exclusive or exhaustive explanation of the invention. Further limitations and disadvantages of conventional and traditional approaches will become apparent to one of skill in the art, through comparison of such systems with some aspects of the present invention as set forth in the remainder of the present application with reference to the drawings.

SUMMARY OF THE DISCLOSURE

Gain independent reference channel measurement system and method. A method of making robust, stable measurements, in a variety of different applications is disclosed. More specifically, this disclosure describes systems and methods relating to performing gain independent reference channel measurements by making two phase measurements of a device under test. Mathematically, the measurements are combined and many common mode parameters drop out. The result yields an analysis of a device under test analysis which mitigated errors, predominately arising from environmental variations and changes in circuit behavior stemming from swings in signal input.

According to one aspect of the present disclosure is an apparatus for an analog signal processing circuit having at least two amplifiers connected by a switch that allows these amplifiers to connect to either inputs in succession.

According to another aspect, these measurements of the two sensors are carried out in succession such that in the first instance first amplifier is connected to the first sensor and the second amplifier is connected to the second sensor. While according to the second instance, the first amplifier is connected to the second sensor and the second amplifier is connected to the first sensor. These measurements are then combined to provide measurements that only depend on the relative sensor responses and not on the amplifier gains.

According to one aspect of the present disclosure, an analog front end (AFE) is used as the analog signal processing circuit.

According to one or more aspects of the present disclosure, the AFE is used to measure plethysmography (PPG) signals where the two photodiodes are placed at two different distances and both photodiodes measure light having passed thru the tissue.

According to one or more aspects of the present disclosure, the AFE is used to measure PPG signals where the two photodiodes are placed such that one photodiode directly monitors the LED while the other measures light having passed thru the tissue.

According to one or more aspects of the present disclosure, the AFE is used to measure optical signals where LED or stimulus light source is monitored using its current via electrical measurement while the optical signal is measured by the photodiode.

According to one or more aspects of the present disclosure, the AFE is used to measure impedances in which direct measurement of test impedance is measured relative to the standard or reference impedance.

According to one or more aspects of the present disclosure, the AFE is used to measure attenuation of light from smoke and other scattering particles placed between the light source and detector.

According to one or more aspects of the present disclosure, the AFE is used to measure variation in light due to changes in distance from the light source to the detector.

According to one or more aspects of the present disclosure, the AFE is used to measure variation in absorption due to varying concentration of absorber in which the sense channel and reference channel are placed at two different distances from the light source.

The drawings show exemplary stable, robust method for measuring sensors in a manifold of applications and configurations thereof. Variations of these circuits, for example, changing the positions of, adding, or removing certain elements from the circuits are not beyond the scope of the present invention. The illustrated stable measurement circuit devices and configurations are intended to be complementary to the support found in the detailed description.

BRIEF DESCRIPTION OF THE DRAWINGS

The present disclosure is best understood from the following detailed description when read with the accompanying figures. It is emphasized that, in accordance with the standard practice in the industry, various features are not necessarily drawn to scale, and are used for illustration purposes only. Where a scale is shown, explicitly or implicitly, it provides only one illustrative example. In other embodiments, the dimensions of the various features may be arbitrarily increased or reduced for clarity of discussion.

For a fuller understanding of the nature and advantages of the present invention, reference is made to the following detailed description of preferred embodiments and in connection with the accompanying drawings, in which.

DETAILED DESCRIPTION

The present disclosure relates to a method of making stable measurements, in a variety of different applications. More specifically, this disclosure describes systems and methods relating to performing gain independent reference channel measurements and applications thereto.

The following description and drawings set forth certain illustrative implementations of the disclosure in detail, which are indicative of several exemplary ways in which the various principles of the disclosure may be carried out. The illustrative examples, however, are not exhaustive of the many possible embodiments of the disclosure. Other objects, advantages and novel features of the disclosure are set forth in the proceeding in view of the drawings where applicable.

A new reference channel measurement technique that is more stable and superior to the traditional reference channel measurement is disclosed. Many sense modalities require stimulation of the device under test (DUT) with light or electromagnetic radiation or electrical voltage or current and measure the response. The changes in the response represents the changes in the environment of the sensor. Example includes optical measurement of changes in transmission or reflection due to underlying material property changes, changes in impedance of the material as a function of temperature and or some other environmental parameters.

This list of applications is numerous. In many of these instances, it is very important to ensure that the measured value does not depend on the variation in the gain of the electronic signal processing or changes in the intensity of stimulus due to varying temperature or voltage.

Figure 1:
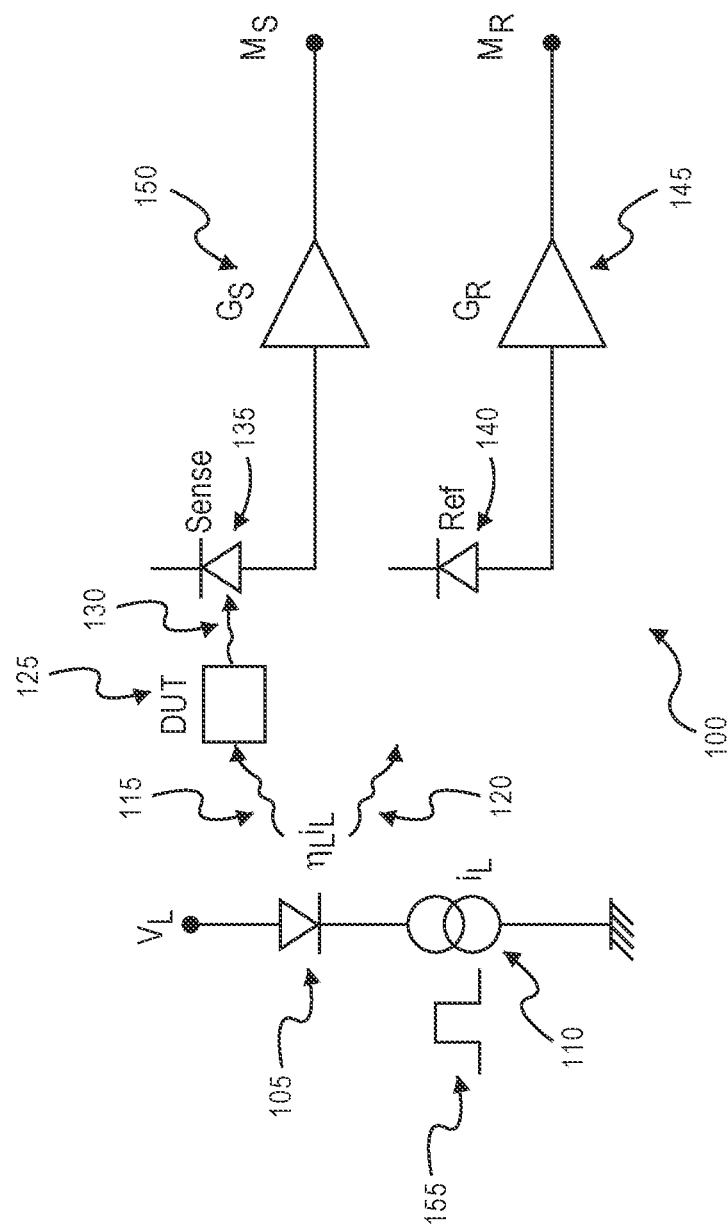
FIG. 1 shows an exemplary optical reference channel monitoring circuit in a first mode, in accordance with some embodiments of the disclosure provided herein.

The traditional method for making these measurements in more stable fashion is to use a reference channel. This will now be discussed in the context of the present disclosure. FIG. 1 shows an exemplary optical reference channel monitoring circuit 100 in a first mode, in accordance with some embodiments of the disclosure provided herein.

Optical reference channel monitoring circuit 100 comprises light emitting diode (LED) 105, function generator 110, device under test (DUT) 125, sense detector 135, reference detector 140, sense amplifier 150, and reference amplifier 145.

Function generator 110 is a piece of electronic test equipment or software used to generate different types of electrical waveforms over a wide range of frequencies. Some of the most common waveforms produced by the function generator are the sine wave, square wave, triangular wave and sawtooth shapes. These waveforms can be either repetitive or single-shot (which requires an internal or external trigger source). In one or more embodiments, function generator 110 is current source configured to produce a square-wave pulse 155. However, any type of current and/or voltage source is not beyond the scope of the present disclosure. Furthermore, there is no necessity to produce particular signals. Reproducibility is rather an objective to achieve the desired results.

Current from function generator 110 passes through light emitting diode (LED) 105. In turn, light emitting diode (LED) 105 produces light, some of which (light 105) impinges on device under test (DUT) 125 while other light 120 is directly received at reference detector 140. The specificity of device under test (DUT) 125 depends on the application. Some of the applications will be discussed in greater detail later in the disclosure. For the present exemplary embodiment, device under test (DUT) 125 is an abstraction whose light output 130 depends on the received light 105.

Sense detector 135 receives light 130. In one or embodiments, sense detector 135 and reference detector 140 are photodetectors. Photodetectors are sensors of light or other electromagnetic energy. Photodetectors have p-n junctions that converts light photons into current. The absorbed photons make electron-hole pairs in the depletion region, which is used to detect received light intensity. In some embodiments, photodetectors are photodiodes or phototransistors. However, any light detecting means, e.g., avalanche, photo-multiplier tube, etc., is not beyond the scope of the present disclosure.

In one or more embodiments, LED 105 is an off-the-shelf green (495 nm-570 nm) light emitting diode. However, any suitable compact light producing device is not beyond the scope of the present disclosure—whether coherent, incandescent, or even thermal black-body radiation, etc.

In the present embodiment, the stimulus or light emitted 115, 120 from a light source such as LED 105 is measured in two ways. Part of the stimulus (light) is measured after interacting with the DUT 125 forming the sense channel at the sense detector 135. Meanwhile at the reference detector 140, the same stimulus (light 120) is measured directly forming a reference channel.

The two measurements may be written as:

$$M_s = \eta_l I_l H_{dut} R_s G_s$$

$$M_R = \eta_l I_l H_R R_R G_R \quad (1)$$

Here $I_l$ is the current stimulus which is converted to light with efficiency $\eta_l$ which then interacts with the DUT transforming the stimulus by $H_{dut}$ and then converted back to electrical domain with detector of responsivity $R_s$ and then processed by electronic circuit with gain G. Similar measurement is done with the reference channel. Clearly taking ratio makes it independent of the variation in the stimulus itself. This is shown below:

$$\rho_{traditional} = \frac{M_S}{M_R} = \frac{\eta_l I_l H_{dut} R_S G_S}{\eta_l I_l H_R R_R G_R} = \frac{H_{dut} R_S G_S}{H_R R_R G_R} = \left(\frac{H_{dut}}{H_R}\right)\left(\frac{R_S}{R_R}\right)\left(\frac{G_S}{G_R}\right) \quad (2)$$

Since the measurement of interest is the changes in the first term in the bracket, i.e., measurement of $H_{dut}$, the variation of the other two bracketed terms must be minimized or eliminated. The present disclosure presents a method to eliminate the last bracket and make the measurement independent of the ratio $$\frac{G_S}{G_R},$$

which will now be discussed in greater detail.

Figure 2:
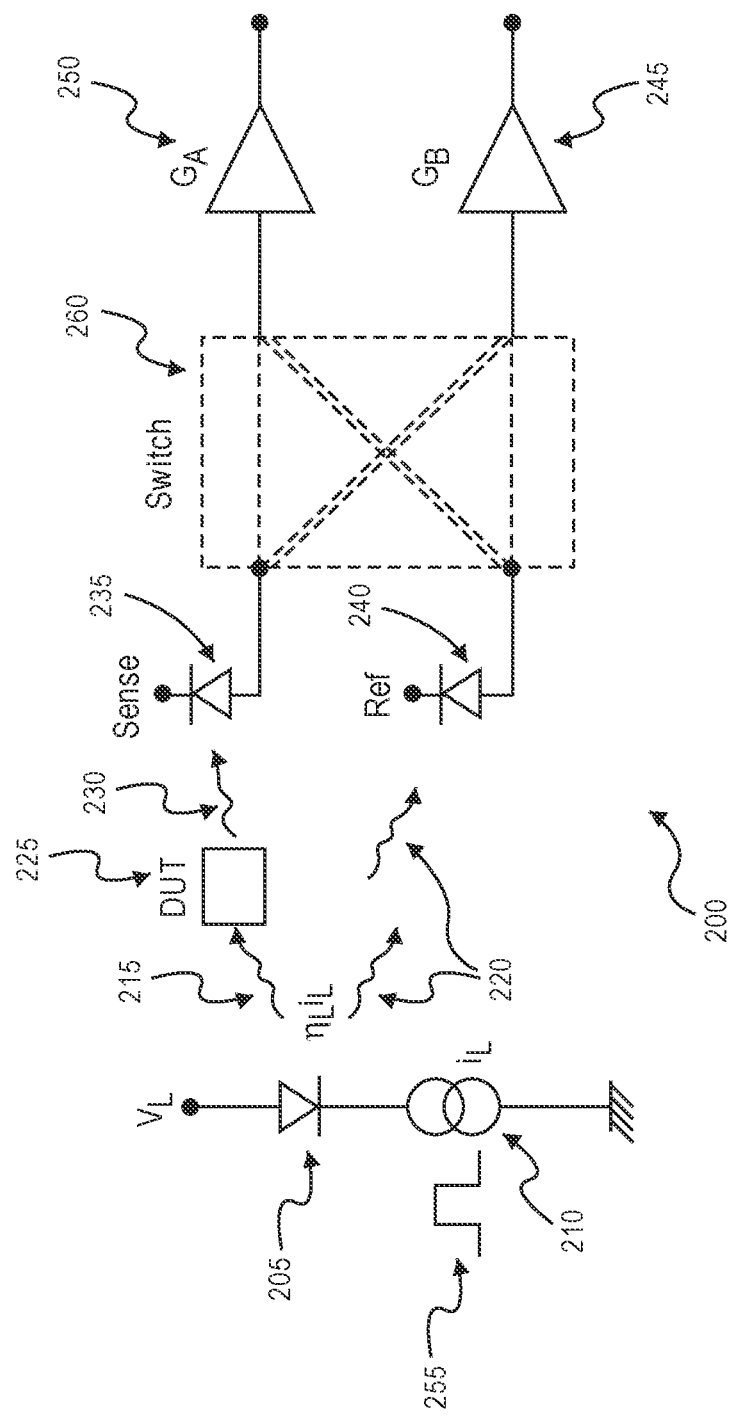
FIG. 2 shows an exemplary optical reference channel monitoring circuit in another mode, in accordance with some embodiments of the disclosure provided herein.

FIG. 2 shows an exemplary optical reference channel monitoring circuit in another mode, in accordance with some embodiments of the disclosure provided herein. Optical reference channel monitoring circuit 200 comprises light emitting diode (LED) 205, function generator 210, device under test (DUT) 225, sense detector 235, reference detector 240, switch fabric 260, sense amplifier 250, and reference amplifier 245.

Similarly, to previously described, function generator 210 is a piece of electronic test equipment or software used to generate different types of electrical waveforms over a wide range of frequencies. Some of the most common waveforms produced by the function generator are the sine wave, square wave, triangular wave and sawtooth shapes. These waveforms can be either repetitive or single-shot (which requires an internal or external trigger source). In one or more embodiments, function generator 210 is current source configured to produce a square-wave pulse 155. However, any type of current and/or voltage source is not beyond the scope of the present disclosure. Furthermore, there is no necessity to produce particular signals. Reproducibility is rather an objective to achieve the desired results.

Current from function generator 210 passes through light emitting diode (LED) 205. In turn, light emitting diode (LED) 205 produces light, some of which (light 205) impinges on device under test (DUT) 225 while other light 220 is directly received at reference detector 240. The specificity of device under test (DUT) 225 depends on the application. Some of the applications will be discussed in greater detail later in the disclosure. For the present exemplary embodiment, device under test (DUT) 225 is an abstraction whose light output 230 depends on the received light 205.

In one or more embodiments, switch fabric 260 comprises one or more transistors configured to cross switch at a predetermined time, which may or may not be coordinated with the input signal 255. A transistor is a semiconductor device used to amplify or switch electronic signals and electrical power. It is composed of semiconductor material usually with at least three terminals for connection to an external circuit. A voltage or current applied to one pair of the transistor's terminals controls the current through another pair of terminals.

Transistors which can be used include metal-oxide-semiconductor field-effect transistors (MOSFETs) and bipolar junction transistors (bipolar transistor or BJTs) which is a type of transistor that uses both electrons and holes as charge carriers. MOSFETs are a type of insulated-gate field-effect transistor (IGFET) that are fabricated by the controlled oxidation of a semiconductor, typically silicon. However, any transistor or digital circuit is not beyond the scope of the present disclosure.

In some embodiments, switch fabric 260 is a switching circuit which is known in the art. In other embodiments, switch fabric 260 is an analog multipole relay. In practice, switch fabric 260 directs the signal received from sense detector 235 to either sense amplifier 250 or reference amplifier 245. Similarly, switch fabric 260 directs the signal received from reference detector 240 to either sense amplifier 250 or reference amplifier 245. The importance of cross coupling will be discussed later in the disclosure.

Sense detector 235 receives light 230. In one or more embodiments, sense detector 235 and reference detector 240 are photodetectors. Photodetectors are sensors of light or other electromagnetic energy. Photodetectors have p-n junctions that converts light photons into current. The absorbed photons make electron-hole pairs in the depletion region, which is used to detect received light intensity. In some embodiments, photodetectors are photodiodes or phototransistors. However, any light detecting means, e.g., avalanche, photo-multiplier tube, etc., is not beyond the scope of the present disclosure.

In the present embodiment, the stimulus or light emitted 215, 220 from a light source such as LED 205 is measured in two ways. Part of the stimulus (light) is measured after interacting with the DUT 225 forming the sense channel at the sense detector 235. Meanwhile at the reference detector 240, the same stimulus (light 220) is measured directly forming a reference channel.

To illustrate in practice, an optical measurement embodiment is exemplified, but the idea applies more generally. In broadest perspective, this is accomplished by at least two-phase measurement to divide out all common mode changes in the path of the measurement system including the variations in the signal conditioning circuit (SCC). FIG. 2 expands on FIG. 1 and illustrates how this is accomplished.

This is done in two steps. In the first phase of the measurement sequence, switch connects sense channel to amplifier with gain $G_A$ and the reference channel is connected to amplifier with gain $G_B$. From above equation 1 is rewritten as follows:

$$M_{s1} = \eta_l I_l H_{dut} R_s G_A$$

$$M_{R1} = \eta_l I_l H_R R_R G_B \quad (3)$$

In the second phase of the measurement, stimulus is presented again but the switch is moved to the crossed position such that sense channel is now connected to amplifier with gain $G_B$ and the reference channel to $G_A$. This yields:

$$M_{s2} = \eta_l I_l H_{dut} R_s G_B$$

$$M_{R2} = \eta_l I_l H_R R_R G_A \quad (4)$$

From these two measurements, a combination can be formed to eliminate both variation in stimulus as in traditional reference channel-based measurement but also gains of the amplifier. This is done by:

$$\rho = \frac{M_{S1} + M_{S2}}{M_{R1} + M_{R2}} = \frac{\eta_l I_l H_{dut} R_s G_A + \eta_l I_l H_{dut} R_s G_B}{\eta_l I_l H_R R_R G_B + \eta_l I_l H_R R_R G_A} = \left(\frac{H_{dut}}{H_R}\right)\left(\frac{R_S}{R_R}\right) \quad (5)$$

This simple operation creates enormous advantages in the signal measurement as it lifts the burden of very high gain stability from the signal processing AFE. In general, the two phases of measurement are carried out in rapid succession. This method even suppresses to a high degree even the changes in the gains between the two measurements. Suppose $\delta G$ is the small change in the gains of the amplifiers between the two successive measurements. Then simple algebra will show that the error in $\rho$ is:

$$\rho = \left(\frac{H_{dut}}{H_R}\right)\left(\frac{R_S}{R_R}\right)\left(1 + \delta G\left(\frac{G_A - G_B}{G_A + G_B}\right)\right)$$

The error term is likely to be less than $10^{-5}$ since changes in gain $\delta G$ in a short time between phases are likely to be $<10^{-3}$ and for a nominally matched gains, the term $$\left(\frac{G_A - G_B}{G_A + G_B}\right)$$

is also likely to be less than 1%. This shows that this measurement method is highly robust.

Even though reference channel measurements are very common and are usually done at the system level or board level or even at the instrument level, a novel approach is provided as a new built-in technique to the circuit architecture that allows a far better and more efficient reference channel measurement. It eliminates concerns around the long-term drift of the amplifiers and circuits that allows for use in systems that need long-term stability such as smoke detectors, gas absorption sensors, optical tissue measurements, sensors that change impedance in response to environment such as temperature, humidity etc.

As a matter of practice, some of the terms in equation 5 can be calibrated out by providing a standard $H_{dut}^0$ at the time of calibration. Then the new ratio:

$$\frac{\rho}{\rho_0} = \left(\frac{H_{dut}}{H_R}\right)\left(\frac{R_S}{R_R}\right) \bigg/ \left(\frac{H_{dut}^0}{H_R}\right)\left(\frac{R_S}{R_R}\right) = \frac{H_{dut}}{H_{dut}^0} \quad (6)$$

Thus, this method makes it convenient to directly compare the measurement to the standard.

Figure 3:
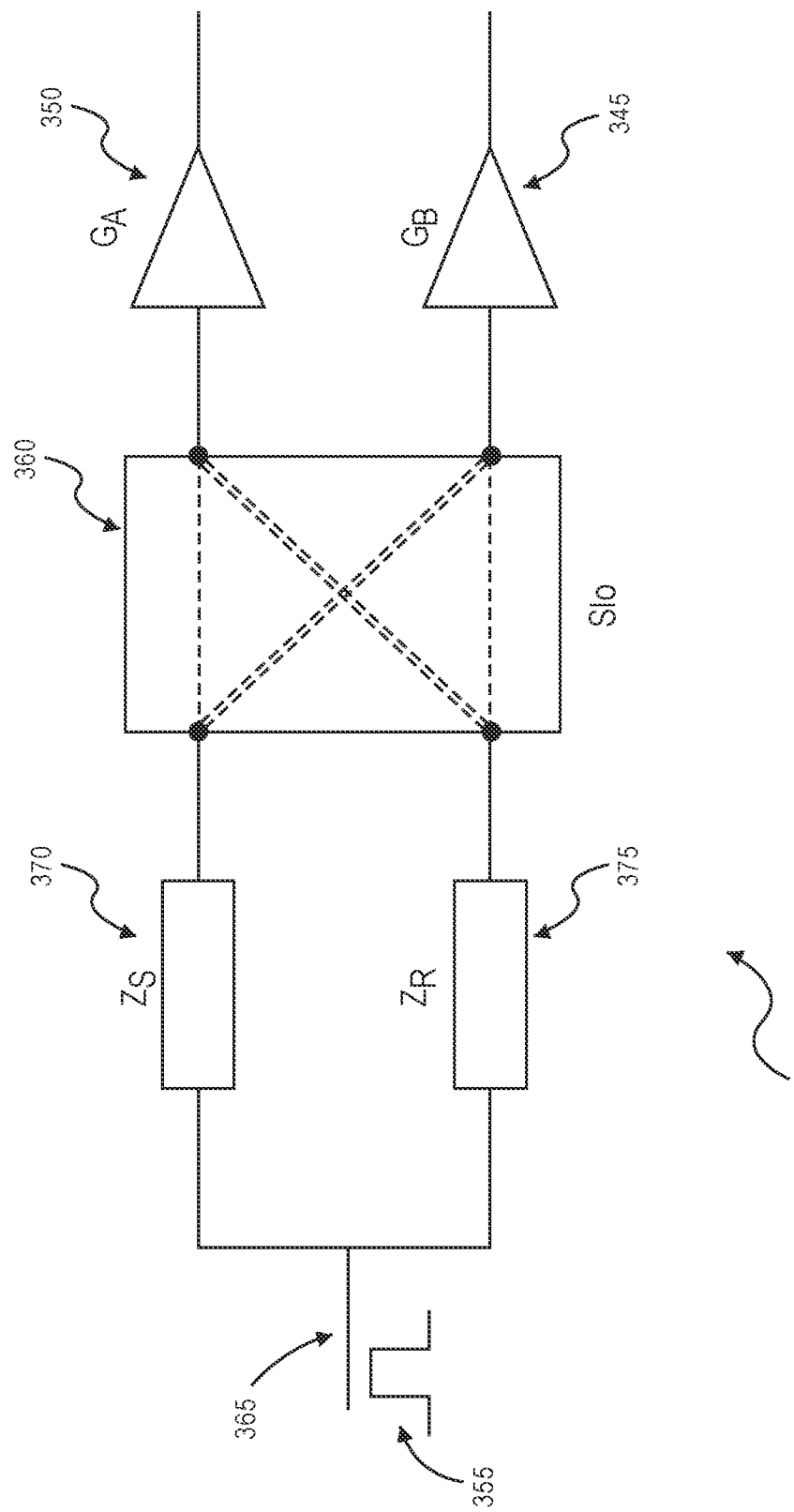
FIG. 3 demonstrates an exemplary reference channel monitoring circuit in an impedance variation (complex or otherwise), in accordance with some embodiments of the disclosure provided herein.

This method can be applied more widely than the previous embodiments above. FIG. 3 is an application of this method to the measurement of resistance (or impedance) to a very high precision and stability is elucidated.

FIG. 3 demonstrates an exemplary reference channel monitoring circuit 300 in an impedance variation (complex or otherwise), in accordance with some embodiments of the disclosure provided herein. Reference channel monitoring circuit 300 comprises input node 365, sense impedance 370, reference impedance 375, switch fabric 360, sense amplifier 350, and reference amplifier 345.

In one or more embodiments, switch fabric 360 comprises one or more transistors configured to cross switch at a predetermined time, which may or may not be coordinated with the input signal 355. Transistors which can be used include metal-oxide-semiconductor field-effect transistor (MOSFET) and bipolar junction transistor (bipolar transistor or BJT) which is a type of transistor that uses both electrons and holes as charge carriers.

In some embodiments, switch fabric 360 is a switching circuit which is known in the art. In other embodiments, switch fabric 360 is an analog multipole relay. In practice, switch fabric 360 directs the signal received from sense detector 335 to either sense amplifier 350 or reference amplifier 345. Similarly, switch fabric 360 directs the signal received from reference detector 340 to either sense amplifier 350 or reference amplifier 345.

In this case, light source is replaced by a voltage stimulus over node 365, and current is directly measured. In this case, the ratio is directly:

$$\rho = \left(\frac{v}{Z_R}\right) \bigg/ \left(\frac{v}{Z_S}\right) = \frac{Z_S}{Z_R} \quad (7)$$

Figure 4:
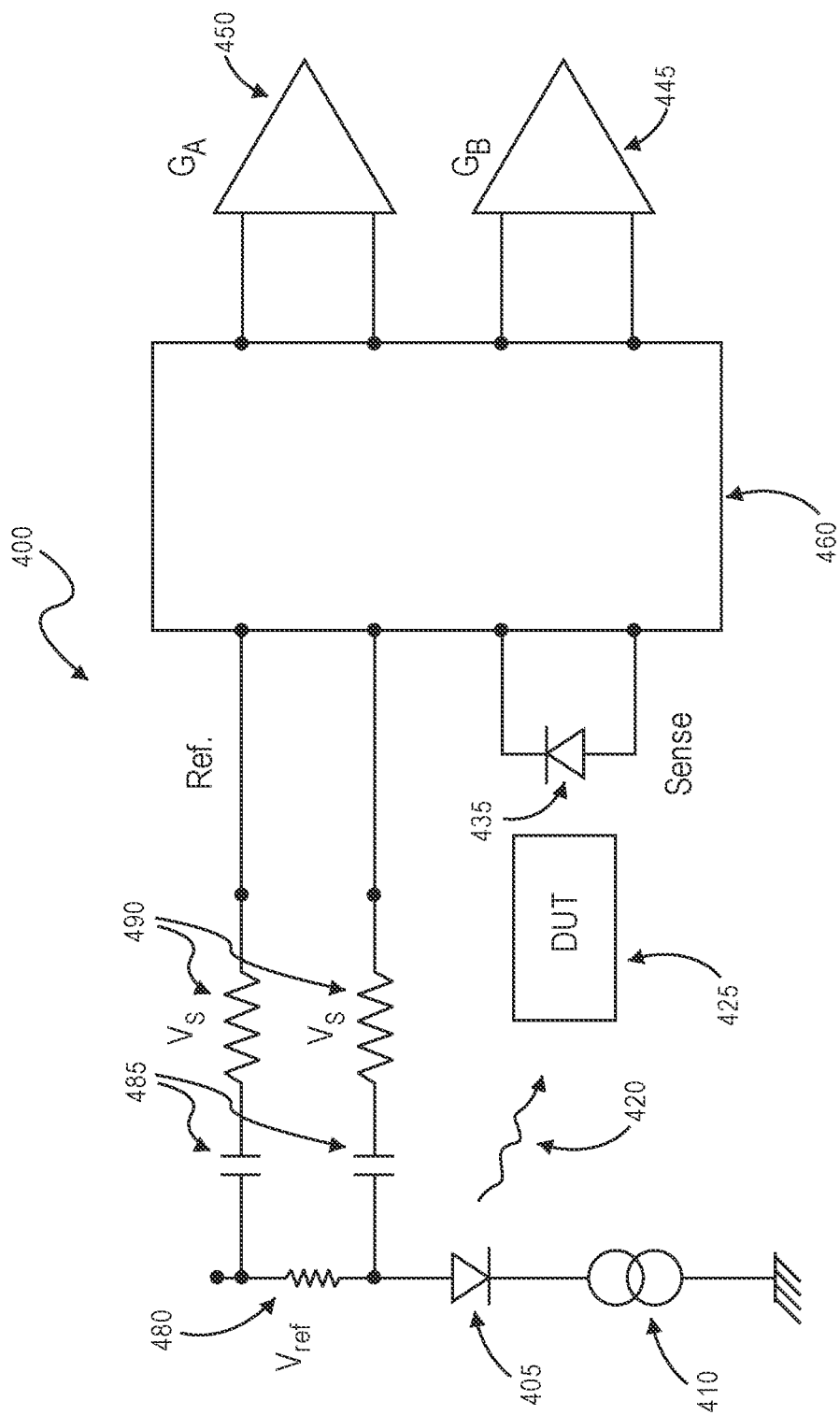
FIG. 4 demonstrates an exemplary reference channel monitoring circuit within a mixed reference channel, wherein the sense measurement signal is optical while the reference signal is electrical, in accordance with some embodiments of the disclosure provided herein.

In FIG. 4, a "mixed" reference channel measurement is demonstrated in implantation and practice. The sense measurement is optical while the reference channel is electrical. FIG. 4 demonstrates an exemplary reference channel monitoring circuit 400 within a mixed reference channel, wherein the sense measurement signal is optical while the reference signal is electrical, in accordance with some embodiments of the disclosure provided herein.

Electrical reference channel monitoring circuit 400 comprises light emitting diode (LED) 405, function generator 410, device under test (DUT) 425, series resistor 480, sense detector 435, reference circuit (capacitors 485 and reference resistors 490) switch fabric 460, sense amplifier 450, and reference amplifier 445.

A small series resistor 480 is added in series with the LED (or laser) 405 and the voltage ($V_{ref}$) is measured across it, thereby measuring the current. FIG. 4 shows this resistor 480 near the voltage supply (not shown) to the LED 405 and then this small voltage is "converted" back to current input via DC blocking capacitors 485 and series reference resistors 490.

Thus, this can be connected to the same amplifier as the photodiode input amplifier via switch fabric 460. The sense resistor $r_{led}$ 480 can also be placed near ground. In this case of FIG. 4, the reference channel will "cancel" the variation in the driver current but not those due to the LED 405 itself. The ratio is approximately given by (more exact expression including capacitance etc. can be easily written but the basic idea is easily illustrated by ignoring capacitor $c_s$):

$$\rho = \left(\frac{\frac{\eta_l}{r_{led}}}{r_S}\right)(H_{dut})(R_S) \quad (8)$$

Some practical, non-exhaustive applications of this idea will now be discussed.

Figure 5:
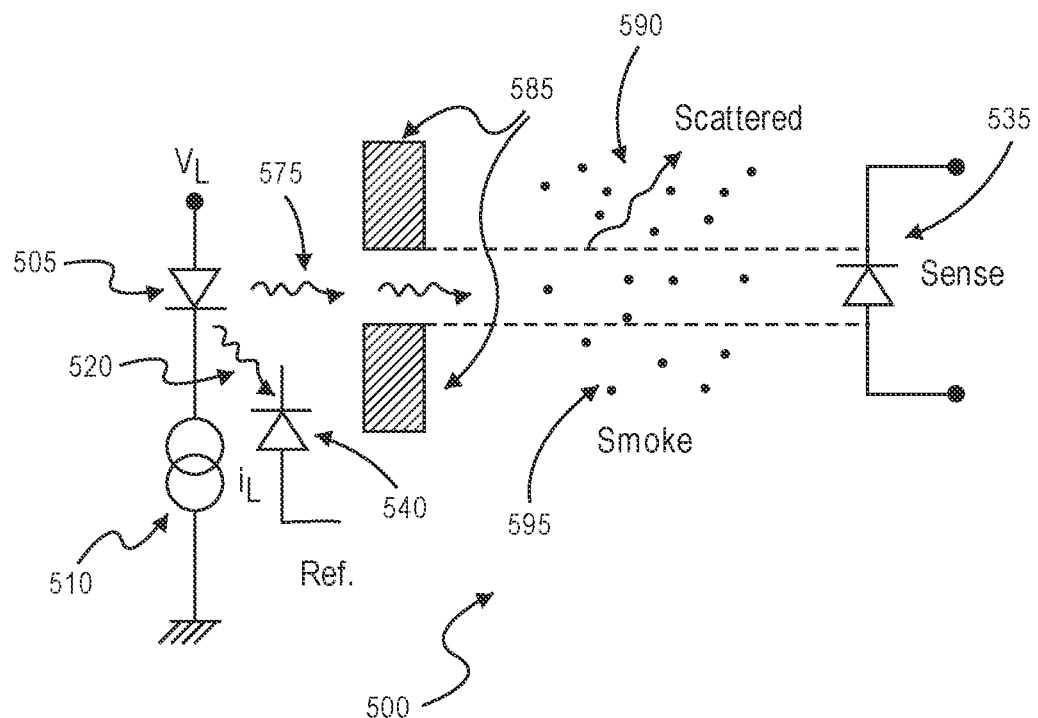
FIG. 5 illustrates an exemplary optical reference channel monitoring circuit within the context of another application, in accordance with some embodiments of the disclosure provided herein.

Application 1: Ultra-Stable Intensity Measurement in Reflection, Transmission, Absorption, and Scattering This is illustrated with smoke measurement in FIG. 5. FIG. 5 illustrates an exemplary optical reference channel monitoring circuit within the context of another application, in accordance with some embodiments of the disclosure provided herein.

Reference channel monitoring circuit 500 comprises light emitting diode (LED) 505, function generator 510, sense detector 535, reference detector 540, and blocking elements 585. One skilled in the art will appreciate that some circuit elements have been omitted but the principle remains same as one or more of the previous embodiments.

In practice, some light 575 produced from light emitting diode (LED) 505 passes through an aperture which is defined by blocking elements 585. Some light 575 gets scattered 590 off of smoke particles 595. And, some light 575 proceeds unimpeded and is received at sense detector 535. One or ordinary skill will recognize the present implementation as an obscuration sensor. Other light 520 produced from light emitting diode (LED) 505 is incident upon reference detector 540.

Smoke particles 595 between detector 535 and LED 505 cause reduction in light intensity by scattering light 590. Typical smoke alarm thresholds may be as low as 1%/ft—or smoke causes 1% light attenuation with one-foot path length. A 1 cm path length—which makes for a very small and compact device—implies that we need to measure changes at $10^{-4}$ level. That is not very hard—to maintain SNR of ~80 dB. What is difficult is to maintain the stability of the amplifiers, LED etc. at this level so that heat and other environmental parameters do not cause measurement to shift. Again, the technique demonstrated makes such measurement possible in a compact sensor.

This stability can be used to measure small changes in distance by using intensity and the fact that intensity falls off as a function of distance. Again, this requires that variations from all other environmental parameters get suppressed.

Application 2: PPG Measurements

A photoplethysmogram (PPG) is an optically obtained plethysmogram that can be used to detect blood volume changes in the microvascular bed of tissue. A PPG is often obtained by using a pulse oximeter which illuminates the skin and measures changes in light absorption. A conventional pulse oximeter monitors the perfusion of blood to the dermis and subcutaneous tissue of the skin.

Figure 6:
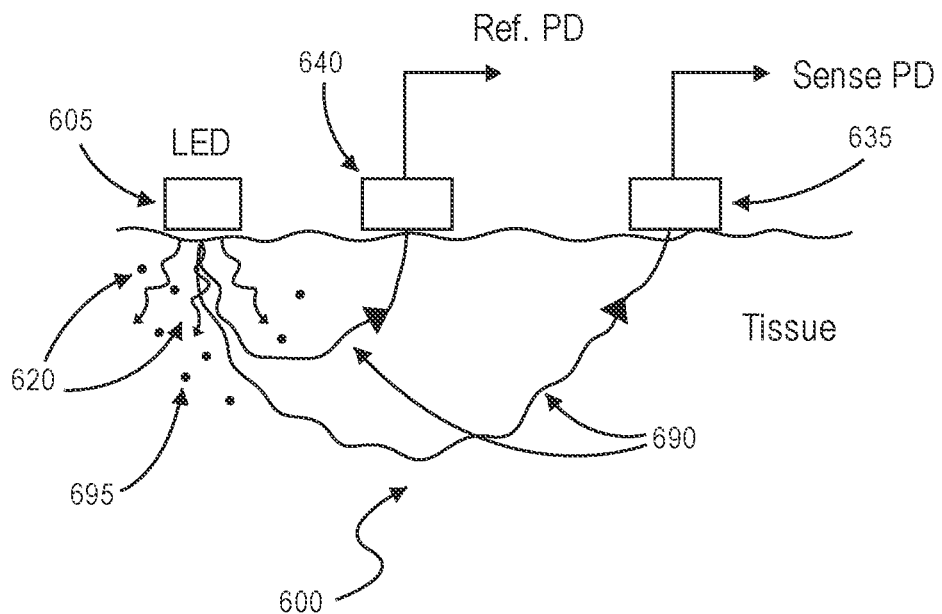
FIG. 6 illustrates an exemplary optical reference channel monitoring circuit within the application of yet another application, in accordance with some embodiments of the disclosure provided herein.

FIG. 6 illustrates an exemplary optical reference channel monitoring circuit within the application of yet another application, in accordance with some embodiments of the disclosure provided herein. Reference channel monitoring circuit 600 comprises light emitting diode (LED) 605, sense detector 635, and reference detector 640. One skilled in the art will appreciate that some circuit elements have been omitted but that the principle remains the same as one or more of the previous embodiments.

In practice, light emitting diode (LED) 605 produces light 620 which in turn get scattered off of a predetermined chemical, e.g., $SpO_2$, within the tissue of a subject (patient). Subsequently scatter light 690 gets detected by either reference detector 640 or sense detector 635, depending on scattering trajectory and mean-free-path. This is a function of the light wavelength and chemical interaction which is known in the art.

In one or more embodiments, a separate photodiode may be deployed to act as reference channel to eliminate low frequency variations in the LED's output due to temperature and supply variations. Since a heart beats at roughly 1 Hz, this low-frequency elimination of LED's variation as well as any variation in gains allows one to reach high SNR even with noisy power supplies that generally add lots of noise and systematic variations at low frequencies.

In yet another embodiment associated with FIG. 6, two photodiodes can be used with one closer to the LED designated as the reference PD while the one further away acting as signal PD.

In this case, even the variation in the LED's light coupling to the tissue becomes common mode and are eliminated. This will allow more precise measurement of the tissue scattering and absorption.

Application 3: Gas Absorption Measurement

Figure 7:
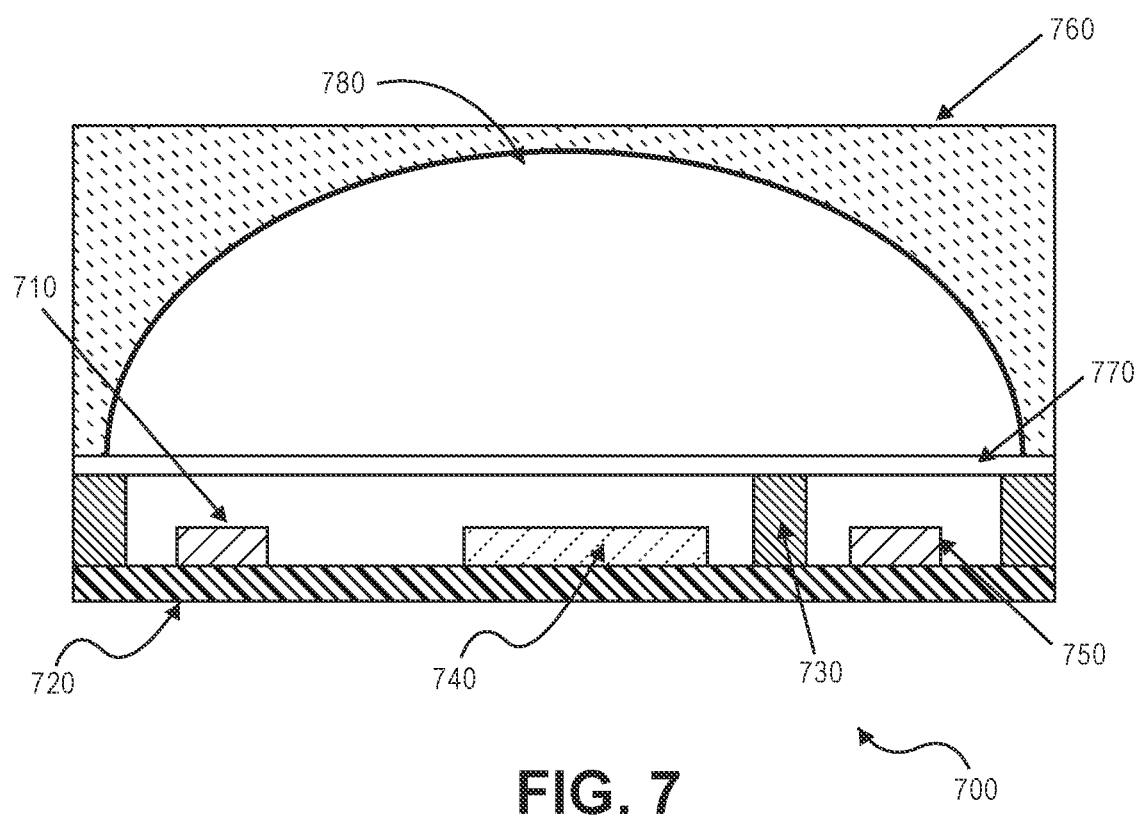
FIG. 7 shows a side view of an exemplary optical gas detection measurement system, in accordance with some embodiments of the disclosure provided herein.

FIG. 7 shows a side view of an exemplary optical gas detection measurement system 700, in accordance with some embodiments of the disclosure provided herein. Optical gas detection measurement system 700 comprises substrate 720, LED 710, reflective surface 780, cap 760, cover 970, photodetector 740, photodetector 750 and septum 730.

In practice, gas detection is performed as follows. LED 750 produces light, some of which enters the gas chamber defined by reflective surface 780. Another portion of light directly impinges on photodetector 740 which act as the previously described reference channel, at least in part. Cap 760 is a packaging choice. In one or more embodiments, cap 760 includes a gas chamber defined by the boundaries of reflective surface 780. Typically, gas chamber comprises ingress and egress apertures (not shown) to allow for the passage of gas though the chamber.

In some embodiments, cap 760 is three-dimensional conic-section shaped surface, such as, an ellipsoid or paraboloid. However, other shapes are not beyond the scope of the present invention. For example, two dimensional conic sections (as viewed from the side as shown) can be almost as effective in detection. Further still, one side can be a simple plane oriented at 45-degree angle in relation to photodetector 750. In practice, light will reflect twice on average while traversing through the gas chamber before being detected by photodetector 750.

Septum 730 is disposed between LED 710 and photodetector 750 such that light does not pass directly to the photodetector 750. In the present embodiment, photodetector 750 is the aforementioned sense detector, as least in part. In one or more embodiments, cover 770 can be used to simplify packaging. In others, cover 770 can be optical filters which are known in the art.

Figure 8:
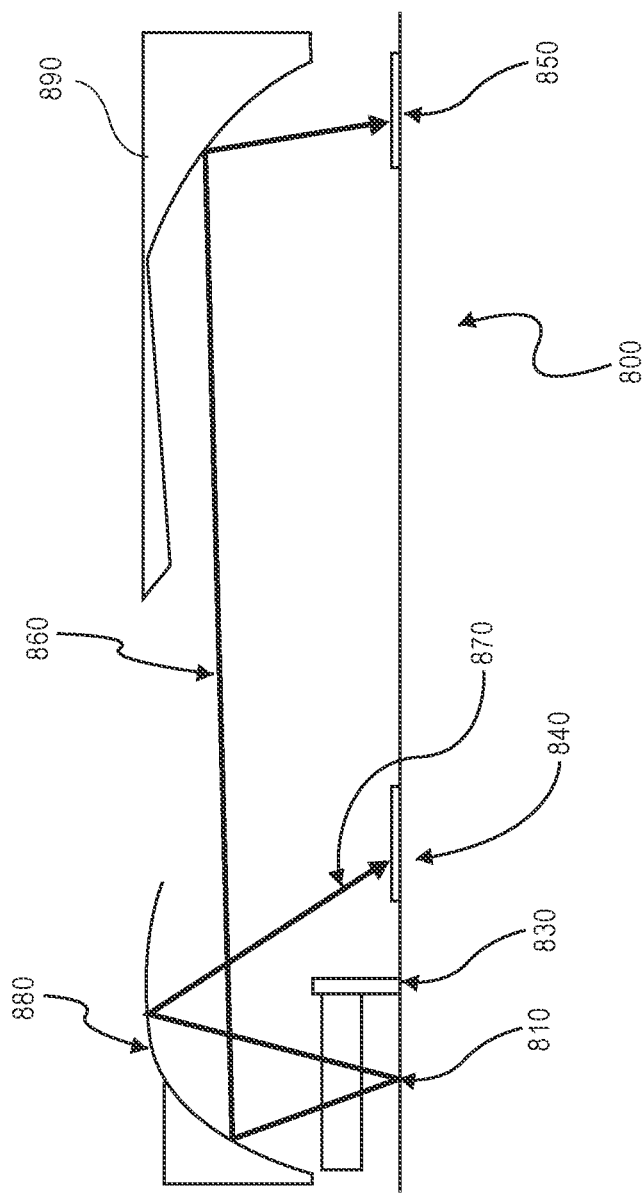
FIG. 8 depicts the side view of an exemplary differential path length gas detection system, in accordance with some embodiments of the disclosure provided herein.

FIG. 8 depicts the side view of an exemplary differential path length gas detection system 800, in accordance with some embodiments of the disclosure provided herein. Optical differential gas detection measurement system 800 comprises substrate, LED 810, reflective surfaces 880, 890, photodetector 840, photodetector 850 and septum 830.

In practice, differential gas detection is performed as follows. LED 850 produces light, primary path 860 and reference path 870, which enters into gas chamber. Similar to that previously described, gas chamber is defined by the boundaries of reflective surfaces 880, 890. Typically, gas chamber comprises ingress and egress apertures (not shown) to allow for the passage of gas though the chamber.

In some embodiments, reflective surfaces 880, 890 can be three-dimensional conic-section shaped surfaces, such as, an ellipsoids or paraboloids. However, other shapes are not beyond the scope of the present invention. For example, two dimensional conic sections (as viewed from the side as shown) can be almost as effective in detection. Further still, one side can be a simple plane oriented at 45-degree angle in relation to photodetector 850. In practice, light (primary path 860) will reflect twice on average while traversing through the gas chamber before being detected by photodetector 850. Whereas, reference path 870 will only reflect once before being detected by reference detector 840.

Septum 830 is disposed to prevent direct illumination of photoreactors 840, 850. In the present embodiment, photodetector 850 is the aforementioned sense detector and photodetector 840 act of the reference detector, as least in part, signal and amplifiers notwithstanding. In some embodiments, optical filters which are known in the art can be disposed proximal to LED 810.

This is illustrated in our differential absorption measurement application. One of ordinary skill in the art will appreciate that reference path 870 will inherently have a shorter pathlength than primary path 860. It is the known (or determined) pathlength difference which is used to calculate optical absorption of a predetermined gas with a corresponding wavelength spectrum.

SELECT EXAMPLES

Example 1 provides an apparatus for making gain independent reference channel measurements, the apparatus comprising a first circuit configured to measure a stimulus passing through a testing object, a first amplifier, a second circuit configured to measure a stimulus which has not passed through the test volume, a second amplifier, and a switching circuit in electrical communication with the first circuit, second circuit, first amplifier and second amplifier.

In the first example, the switching circuit configured to change between a first mode wherein first circuit is in electrical communication with the first amplifier and the second circuit is in electrical communication with the second amplifier, and a second mode wherein first circuit is in electrical communication with the second amplifier and the second circuit is in electrical communication with the first amplifier.

Example 2 provides an apparatus according to example 1 wherein the first circuit comprises a sensor.

Example 3 provides an apparatus according to examples 1-2 wherein the sensor is a photodetector.

Example 4 provides an apparatus according to any one or more of the preceding examples, wherein the second circuit comprises a photodetector.

Example 5 provides an apparatus according to any one or more of the preceding examples further comprising a light source which produces the stimulus.

Example 6 provides an apparatus according to example 5, wherein the light source is an LED.

Example 7 provides an apparatus according to any one or more of the preceding examples, further comprising a current source.

Example 8 provides an apparatus according to example 7, wherein the current source is configured to produce a predetermined waveform in both the first and second mode.

Example 9 provides an apparatus according to any one or more of the preceding examples further comprising an analog front end (AFE) configured to compare output from the first and second gain amplifiers in the first and second modes.

Example 10 provides an apparatus according to any one or more of the preceding examples, wherein the first circuit comprises a transducer.

Example 11 provides an apparatus according to any one or more of the preceding examples, wherein the testing object is a device under test which has an impedance to be measure by the stimuli.

Example 12 provides an apparatus according to any one or more of the preceding examples, wherein the testing object is a testing volume.

Example 13 provides an apparatus according to any one or more of the preceding examples, wherein the testing object is a subject.

Example 14 provides a method for making gain independent reference channel measurements comprising measuring at a first circuit a stimulus passing through a testing object, measuring at a second circuit a stimulus which has not passed through the test volume, receiving at a switch circuit the measurements from the first and second circuits, in a first mode, outputting from the switch circuit the first and second measurement to a first and second amplifier, respectively, switching the switch circuit, and in a second mode, outputting from the switch circuit the first and second measurement to the second and first amplifier, respectively.

Example 15 provides a method according to example 14 further comprising amplifying the first and second measurement in the first and second amplifiers, respectively, during the first mode.

Example 16 provides a method according to any one or more of the preceding examples further comprising amplifying the first and second measurement in the second and first amplifiers, respectively, during the second mode.

Example 17 provides a method according to any one or more of the preceding examples further comprising calculating a ratio based on at least amplified measurements in during the first and second modes.

Example 18 provides a method according to any one or more of the preceding examples further comprising determining the presence of a predetermined species based on the calculated ratio.

Example 19 provides a method according to example 18, wherein the species are smoke particles.

Example 20 provides a method according to example 18, wherein the species is a biochemical.

Example 21 provides a method according to example 18, wherein the species is an inorganic chemical.

Example 22 provides a method according to example 18, wherein the species is an organic chemical.

Example 23 provides a method according to any one or more of the preceding examples, wherein the first circuit comprises a sensor.

Example 24 provides a method according to example 23 wherein the sensor is a photodetector.

Example 25 provides a method according to any one or more of the preceding examples, wherein the second circuit comprises a photodetector.

Example 26 provides a method according to any one or more of the preceding examples further comprising illuminating a light source.

Example 27 provides a method according to example 26 wherein the light source is and LED.

Example 28 provides a method according to example 27 further comprising providing a current through the LED Example 29 provides a method according to any one or more of the preceding examples further comprising producing a predetermined waveform during both the first and second mode.

Example 30 provides a method according to example 17 wherein the ratio is calculated using an analog front end (AFE) configured to compare output from the first and second gain amplifiers in the first and second modes.

Example 31 provides a method according to any one or more of the preceding examples, wherein the testing object is a testing volume.

Example 32 provides a method according to any one or more of the preceding examples, wherein the testing object is a subject.

Example 33 provides for an apparatus for making gain independent reference channel measurements comprising a means for measuring at a first circuit a stimulus passing through a testing object, a means for measuring at a second circuit a stimulus which has not passed through the test volume, a means for receiving at a switch circuit the measurements from the first and second circuits, in a first mode, a means for outputting from the switch circuit the first and second measurement to a first and second amplifier, respectively, a means for switching the switch circuit; and in a second mode, a means for outputting from the switch circuit the first and second measurement to the second and first amplifier, respectively.

Having thus described several aspects and embodiments of the technology of this application, it is to be appreciated that various alterations, modifications, and improvements will readily occur to those of ordinary skill in the art. Such alterations, modifications, and improvements are intended to be within the spirit and scope of the technology described in the application. For example, those of ordinary skill in the art will readily envision a variety of other means and/or structures for performing the function and/or obtaining the results and/or one or more of the advantages described herein, and each of such variations and/or modifications is deemed to be within the scope of the embodiments described herein.

Those skilled in the art will recognize, or be able to ascertain using no more than routine experimentation, many equivalents to the specific embodiments described herein. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, kits, and/or methods described herein, if such features, systems, articles, materials, kits, and/or methods are not mutually inconsistent, is included within the scope of the present disclosure.

The foregoing outlines features of one or more embodiments of the subject matter disclosed herein. These embodiments are provided to enable a person having ordinary skill in the art (PHOSITA) to better understand various aspects of the present disclosure. Certain well-understood terms, as well as underlying technologies and/or standards may be referenced without being described in detail. It is anticipated that the PHOSITA will possess or have access to background knowledge or information in those technologies and standards sufficient to practice the teachings of the present disclosure.

The PHOSITA will appreciate that they may readily use the present disclosure as a basis for designing or modifying other processes, structures, or variations for carrying out the same purposes and/or achieving the same advantages of the embodiments introduced herein. The PHOSITA will also recognize that such equivalent constructions do not depart from the spirit and scope of the present disclosure, and that they may make various changes, substitutions, and alterations herein without departing from the spirit and scope of the present disclosure.

The above-described embodiments may be implemented in any of numerous ways. One or more aspects and embodiments of the present application involving the performance of processes or methods may utilize program instructions executable by a device (e.g., a computer, a processor, or other device) to perform, or control performance of, the processes or methods.

In this respect, various inventive concepts may be embodied as a computer readable storage medium (or multiple computer readable storage media) (e.g., a computer memory, one or more floppy discs, compact discs, optical discs, magnetic tapes, flash memories, circuit configurations in Field Programmable Gate Arrays or other semiconductor devices, or other tangible computer storage medium) encoded with one or more programs that, when executed on one or more computers or other processors, perform methods that implement one or more of the various embodiments described above.

The computer readable medium or media may be transportable, such that the program or programs stored thereon may be loaded onto one or more different computers or other processors to implement various ones of the aspects described above. In some embodiments, computer readable media may be non-transitory media.

Note that the activities discussed above with reference to the FIGURES which are applicable to any integrated circuit that involves signal processing (for example, gesture signal processing, video signal processing, audio signal processing, analog-to-digital conversion, digital-to-analog conversion), particularly those that can execute specialized software programs or algorithms, some of which may be associated with processing digitized real-time data.

In some cases, the teachings of the present disclosure may be encoded into one or more tangible, non-transitory computer-readable mediums having stored thereon executable instructions that, when executed, instruct a programmable device (such as a processor or DSP) to perform the methods or functions disclosed herein. In cases where the teachings herein are embodied at least partly in a hardware device (such as an ASIC, IP block, or SoC), a non-transitory medium could include a hardware device hardware-programmed with logic to perform the methods or functions disclosed herein. The teachings could also be practiced in the form of Register Transfer Level (RTL) or other hardware description language such as VHDL or Verilog, which can be used to program a fabrication process to produce the hardware elements disclosed.

In example implementations, at least some portions of the processing activities outlined herein may also be implemented in software. In some embodiments, one or more of these features may be implemented in hardware provided external to the elements of the disclosed figures, or consolidated in any appropriate manner to achieve the intended functionality. The various components may include software (or reciprocating software) that can coordinate in order to achieve the operations as outlined herein. In still other embodiments, these elements may include any suitable algorithms, hardware, software, components, modules, interfaces, or objects that facilitate the operations thereof.

Any suitably-configured processor component can execute any type of instructions associated with the data to achieve the operations detailed herein. Any processor disclosed herein could transform an element or an article (for example, data) from one state or thing to another state or thing. In another example, some activities outlined herein may be implemented with fixed logic or programmable logic (for example, software and/or computer instructions executed by a processor) and the elements identified herein could be some type of a programmable processor, programmable digital logic (for example, an FPGA, an erasable programmable read only memory (EPROM), an electrically erasable programmable read only memory (EEPROM)), an ASIC that includes digital logic, software, code, electronic instructions, flash memory, optical disks, CD-ROMs, DVD ROMs, magnetic or optical cards, other types of machine-readable mediums suitable for storing electronic instructions, or any suitable combination thereof.

In operation, processors may store information in any suitable type of non-transitory storage medium (for example, random access memory (RAM), read only memory (ROM), FPGA, EPROM, electrically erasable programmable ROM (EEPROM), etc.), software, hardware, or in any other suitable component, device, element, or object where appropriate and based on particular needs. Further, the information being tracked, sent, received, or stored in a processor could be provided in any database, register, table, cache, queue, control list, or storage structure, based on particular needs and implementations, all of which could be referenced in any suitable timeframe.

Any of the memory items discussed herein should be construed as being encompassed within the broad term 'memory.' Similarly, any of the potential processing elements, modules, and machines described herein should be construed as being encompassed within the broad term 'microprocessor' or 'processor.' Furthermore, in various embodiments, the processors, memories, network cards, buses, storage devices, related peripherals, and other hardware elements described herein may be realized by a processor, memory, and other related devices configured by software or firmware to emulate or virtualize the functions of those hardware elements.

Further, it should be appreciated that a computer may be embodied in any of a number of forms, such as a rack-mounted computer, a desktop computer, a laptop computer, or a tablet computer, as non-limiting examples. Additionally, a computer may be embedded in a device not generally regarded as a computer but with suitable processing capabilities, including a personal digital assistant (PDA), a smart phone, a mobile phone, an iPad, or any other suitable portable or fixed electronic device.

Also, a computer may have one or more input and output devices. These devices can be used, among other things, to present a user interface. Examples of output devices that may be used to provide a user interface include printers or display screens for visual presentation of output and speakers or other sound generating devices for audible presentation of output. Examples of input devices that may be used for a user interface include keyboards, and pointing devices, such as mice, touch pads, and digitizing tablets. As another example, a computer may receive input information through speech recognition or in other audible formats.

Such computers may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks or wired networks.

Computer-executable instructions may be in many forms, such as program modules, executed by one or more computers or other devices. Generally, program modules include routines, programs, objects, components, data structures, etc. that performs particular tasks or implement particular abstract data types. Typically, the functionality of the program modules may be combined or distributed as desired in various embodiments.

The terms "program" or "software" are used herein in a generic sense to refer to any type of computer code or set of computer-executable instructions that may be employed to program a computer or other processor to implement various aspects as described above. Additionally, it should be appreciated that according to one aspect, one or more computer programs that when executed perform methods of the present application need not reside on a single computer or processor, but may be distributed in a modular fashion among a number of different computers or processors to implement various aspects of the present application.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

When implemented in software, the software code may be executed on any suitable processor or collection of processors, whether provided in a single computer or distributed among multiple computers.

Computer program logic implementing all or part of the functionality described herein is embodied in various forms, including, but in no way limited to, a source code form, a computer executable form, a hardware description form, and various intermediate forms (for example, mask works, or forms generated by an assembler, compiler, linker, or locator). In an example, source code includes a series of computer program instructions implemented in various programming languages, such as an object code, an assembly language, or a high-level language such as OpenCL, RTL, Verilog, VHDL, Fortran, C, C++, JAVA, or HTML for use with various operating systems or operating environments. The source code may define and use various data structures and communication messages. The source code may be in a computer executable form (e.g., via an interpreter), or the source code may be converted (e.g., via a translator, assembler, or compiler) into a computer executable form.

In some embodiments, any number of electrical circuits of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), memory elements, etc. can be suitably coupled to the board based on particular configuration needs, processing demands, computer designs, etc.

Other components such as external storage, additional sensors, controllers for audio/video display, and peripheral devices may be attached to the board as plug-in cards, via cables, or integrated into the board itself. In another example embodiment, the electrical circuits of the FIGURES may be implemented as standalone modules (e.g., a device with associated components and circuitry configured to perform a specific application or function) or implemented as plug-in modules into application-specific hardware of electronic devices.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this disclosure.

In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Interpretation of Terms

All definitions, as defined and used herein, should be understood to control over dictionary definitions, definitions in documents incorporated by reference, and/or ordinary meanings of the defined terms. Unless the context clearly requires otherwise, throughout the description and the claims:

"comprise," "comprising," and the like are to be construed in an inclusive sense, as opposed to an exclusive or exhaustive sense; that is to say, in the sense of "including, but not limited to".

"connected," "coupled," or any variant thereof, means any connection or coupling, either direct or indirect, between two or more elements; the coupling or connection between the elements can be physical, logical, or a combination thereof.

"herein," "above," "below," and words of similar import, when used to describe this specification shall refer to this specification as a whole and not to any particular portions of this specification.

"or," in reference to a list of two or more items, covers all of the following interpretations of the word: any of the items in the list, all of the items in the list, and any combination of the items in the list.

the singular forms "a", "an" and "the" also include the meaning of any appropriate plural forms.

Words that indicate directions such as "vertical", "transverse", "horizontal", "upward", "downward", "forward", "backward", "inward", "outward", "vertical", "transverse", "left", "right", "front", "back", "top", "bottom", "below", "above", "under", and the like, used in this description and any accompanying claims (where present) depend on the specific orientation of the apparatus described and illustrated. The subject matter described herein may assume various alternative orientations. Accordingly, these directional terms are not strictly defined and should not be interpreted narrowly.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined.

Elements other than those specifically identified by the "and/or" clause may optionally be present, whether related or unrelated to those elements specifically identified. Thus, as a non-limiting example, a reference to "A and/or B", when used in conjunction with open-ended language such as "comprising" may refer, in one embodiment, to A only (optionally including elements other than B); in another embodiment, to B only (optionally including elements other than A); in yet another embodiment, to both A and B (optionally including other elements); etc.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

Thus, as a non-limiting example, "at least one of A and B" (or, equivalently, "at least one of A or B," or, equivalently "at least one of A and/or B") may refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

As used herein, the term "between" is to be inclusive unless indicated otherwise. For example, "between A and B" includes A and B unless indicated otherwise.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively.

Numerous other changes, substitutions, variations, alterations, and modifications may be ascertained to one skilled in the art and it is intended that the present disclosure encompass all such changes, substitutions, variations, alterations, and modifications as falling within the scope of the appended claims.

In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke 35 U.S.C. § 112(f) as it exists on the date of the filing hereof unless the words "means for" or "steps for" are specifically used in the particular claims; and (b) does not intend, by any statement in the disclosure, to limit this disclosure in any way that is not otherwise reflected in the appended claims.

The present invention should therefore not be considered limited to the particular embodiments described above. Various modifications, equivalent processes, as well as numerous structures to which the present invention may be applicable, will be readily apparent to those skilled in the art to which the present invention is directed upon review of the present disclosure.

What is claimed is:

1. An apparatus for making gain independent reference channel measurements, the apparatus comprising:
   a first circuit configured to measure a stimulus passing through a testing object;
   a first amplifier;
   a second amplifier; and
   a switching circuit in electrical communication with the circuit, first amplifier and second amplifier, the switching circuit configured to change between:
   a first mode wherein first testing object is in electrical communication with the first amplifier and the second testing object is in electrical communication with the second amplifier; and
   a second mode wherein first testing object is in electrical communication with the second amplifier and the second testing object is in electrical communication with the first amplifier.

2. The apparatus according to claim 1, wherein the first testing object is a first circuit element.

3. The apparatus according to claim 2, wherein the first circuit element has a first impedance.

4. The apparatus according to claim 2, wherein the second circuit element has a second impedance.

5. The apparatus according to claim 3, wherein the first impedance is complex.

6. The apparatus according to claim 3, wherein the impedance is complex.

7. The apparatus according to claim 1, wherein the second testing object is a second circuit element.

8. The apparatus according to claim 1, wherein the circuit is a voltage generator.

9. The apparatus according to claim 1, wherein the circuit is a current source.

10. The apparatus according to claim 1, wherein the circuit is a signal generator.

11. The apparatus according to claim 1 wherein the circuit is configured to produce a predetermined waveform in both the first and second mode.

12. The apparatus according to claim 1 further comprising an analog front end (AFE) configured to measure outputs from the first and second amplifiers in the first mode.

13. The apparatus according to claim 12 further comprising an analog front end (AFE) configured to measure outputs from the first and second amplifiers in the second m ode.

14. The apparatus according to claim 13 further comprising an analytical circuit configured to compare output from the first and second amplifiers in the first and second modes.

* * * * *